United States Patent [19]

McGirr et al.

[11] Patent Number: 5,129,098

[45] Date of Patent: Jul. 7, 1992

[54] RADIO TELEPHONE USING RECEIVED SIGNAL STRENGTH IN CONTROLLING TRANSMISSION POWER

[75] Inventors: Andrew E. McGirr; Barry J. Cassidy, both of Calgary, Canada

[73] Assignee: NovAtel Communication Ltd., Calgary, Canada

[21] Appl. No.: 587,004

[22] Filed: Sep. 24, 1990

[51] Int. Cl.⁵ .............................................. H04B 1/00
[52] U.S. Cl. ..................................... 455/69; 455/67.1; 455/73; 455/126; 455/127
[58] Field of Search ................... 455/67, 69, 70, 88, 455/89, 126, 127, 116, 234, 245, 246, 250, 251, 73; 375/98

[56] References Cited

U.S. PATENT DOCUMENTS

| | | | |
|---|---|---|---|
| 4,373,206 | 2/1983 | Suzuki et al. | 455/403 |
| 4,475,010 | 10/1984 | Huensch et al. | |
| 4,495,648 | 1/1985 | Giger | 455/73 |
| 4,556,760 | 12/1985 | Goldman | |
| 4,608,711 | 8/1986 | Goldman | |
| 4,760,347 | 7/1988 | Li et al. | |
| 4,777,653 | 10/1988 | Bonnerot et al. | 455/69 |
| 4,811,421 | 3/1989 | Havel et al. | 455/69 |
| 4,870,698 | 9/1989 | Katsuyama et al. | 455/67 |
| 4,870,699 | 9/1989 | Garner et al. | 455/76 |
| 4,885,798 | 12/1989 | Jinich et al. | 455/52 |

FOREIGN PATENT DOCUMENTS

| | | |
|---|---|---|
| 1205140 | 5/1986 | Canada . |
| 1219638 | 3/1987 | Canada . |
| 1226625 | 9/1987 | Canada . |
| 1226626 | 9/1987 | Canada . |
| 0318033 | 11/1988 | European Pat. Off. . |
| 8402043 | 5/1984 | PCT Int'l Appl. . |
| 8701897 | 3/1987 | PCT Int'l Appl. . |
| 2204215A | 11/1988 | United Kingdom . |

Primary Examiner—Reinhard J. Eisenzopf
Assistant Examiner—Chi H. Pham
Attorney, Agent, or Firm—Cesari and Mckenna

[57] ABSTRACT

A radio telephone uses a signal indicating the strength of received communication signals as a measure of prevailing signal propagation conditions to control the gain of a power amplifier in its transmitter. Where conditions are favorable, the gain can be reduced without deleterious effects on transmitted signals, and with a resulting savings in power drain on the radio telephone's power supply (e.g., batteries). In this way, talktime on a single battery charge can be significantly lengthened. Where conditions are adverse, e.g., at outlying or fringe areas of a cellular telephone system of which the radio telephone is a station, the gain can be increased to produce stronger transmitted signals, at times extending the effective coverage area of such systems. Preferably, the output of the power amplifier remains at all times within a power range prescribed by applicable standards, and is increased or decreased within the power range in accordance with prevailing conditions indicated by the received signal strength signal.

22 Claims, 6 Drawing Sheets

RADIO TELEPHONE USING RECEIVED SIGNAL STRENGTH IN CONTROLLING TRANSMISSION POWER

FIELD OF THE INVENTION

The present invention relates to telecommunication apparatus, and more particularly to techniques for dynamically controlling the amplification of communication signals to be transmitted by radio telephones in response to a measure of prevailing signal propagation conditions. The term "radio telephones" is used in its broad sense to include wireless two-way communication devices, including handheld, portable and mobile (i.e., vehicularly mounted) units.

BACKGROUND OF THE INVENTION

Known radio telephones have variable-gain power amplifiers for amplifying modulated radio-frequency ("RF") signals prior to transmission. The gains of the power amplifiers are typically controlled by automatic gain control ("AGC") circuits. Conventional AGC circuits operate dynamically to maintain the amplifier outputs within defined power output tolerances or ranges, and usually at or near nominal values (e.g., intermediate points) within those ranges. Various factors, including changes in ambient temperature and in power supply (e.g., battery) power level, can cause the amplifier output to vary from the targeted output power level. It is the job of the AGC circuits to correct for such variations.

For cellular telephony, generally recognized standards specify the nominal value and a range or tolerance for the amplifier output power. For instance, the Electronic Industries Association/ Telecommunications Industry Association Standard "Mobile Station-Land Station Compatibility Specification", EIA/TIA-553, September, 1989, Section 2.1.2.2. specifies that the power level must be maintained within a 6 dB range from +2 dB to −4 dB of its likewise-specified nominal level over the ambient temperature range of −30 degrees Celsius to +60 degrees Celsius and over the supply voltage range of ±10 percent from the nominal value. Thus, according to that specification, the amplifier output power must be controlled by the AGC circuit so as to fall within a 6 dB range about a nominal power level.

Conventional AGC circuits in such telephones typically target the nominal power level regardless, e.g., of the distance of the station that is to receive the transmitted signal or of other conditions which would otherwise suggest the transmission of stronger or weaker signals from the telephone.

In developing transmission signals of that power level, the transmitter's power amplifier itself consumes most of the dc power required by the radio telephone during audio or voice communication (called "talktime"). As radio telephones become increasingly self-powered, e.g., through the use of on-board, rechargeable storage batteries, its power needs have become an increasingly significant design consideration.

This comes into focus when one considers that, typically, the greater the power requirements of the power amplifier, the shorter the talktime on a single charge of the batteries in the telephone. If steps could be taken to reduce the power requirements by, e.g., reducing the output power of the transmitter amplifier, performance of the telephone could be improved.

SUMMARY OF THE INVENTION

Briefly, the present invention resides in using a signal ("RSSI") indicating the strength of received communication signals as a measure of prevailing transmission propagation conditions in controlling the gain of a power amplifier at the output of the transmitter of a radio telephone.

More specifically, a digital representation of an RSSI is derived from a received communication signal and provided to a central processing unit ("CPU") on-board the radio telephone, which uses the RSSI data in generating a digital control signal. The digital values of this control signal correspond generally to the amplitude, over time, of the RSSI, and, therefore, to prevailing propagation parameters. In addition, the digital values are selected to produce a transmitter output power level tailored to those prevailing propagation parameters. An AGC circuit converts this control signal into an appropriate analog AGC signal for controlling the gain of the RF power amplifier of the transmitter, whereby its output power level reflects the prevailing propagation parameters indicated by the RSSI.

The strength (i.e., field strength or energy) of communication signals over particular channels as indicated by RSSI varies due to terrain and cultural ( e.g., buildings) obstructions or impairments to signal propagation, and to distance between the radio telephone and the base station or cell site with which it is to communicate. The prevailing conditions are, of course, variable; for instance, as the radio telephone is moved, e.g., as an automobile carrying the telephone travels along, the conditions experienced by the telephone communication signal can change. Such prevailing conditions affecting the strength of communication signals as measured by the RSSI can be called signal propagation parameters.

Basic to the invention is the recognition that such an RSSI signal is indicative of signal propagation parameters not only for received signals, but also for transmitted signals. In other words, the transmission propagation parameters characterizing the path taken by the communication signals received by the radio telephone will be generally the same as those characterizing the path taken by the communication signals sent by the radio telephone, provided the communication signals are sent and received at about the same time and location.

Where conditions are favorable, the amplifier's gain can be reduced without deleterious effects on transmitted signals, and with a resulting reduction in the power drain on the radio telephone's power supply (e.g., batteries). In this way, talktime on a single battery charge can be significantly lengthened.

On the other hand, where conditions are adverse, e.g., at outlying or fringe areas of a cellular telephone system of which the radio telephone is a station, the gain can be increased to produce stronger transmitted signals, at times extending the effective coverage area of such systems.

Preferably, the output of the power amplifier remains at all times within a power range prescribed by applicable standards, and is increased or decreased within that power range in accordance with prevailing conditions. In this way, for example, the latitude afforded by the 6 dB range specified by the above-reference standards can be more effectively used by radio telephones embodying the present invention.

Instead of attempting to maintain the amplifier output power at some nominal level, e.g., at an intermediate point within the range, the AGC circuit in accordance with the invention preferably drives the output power to the lowest level within the specified range that provides an adequately strong communication signal in light of prevailing propagation conditions. An "adequately strong" communication signal from a radio telephone used within a cellular telephone system is one which can be received at the intended base station with sufficient strength so as to produce a received baseband signal with at least about a 14 dB signal-to-noise ratio.

Overall, the invention can enhance performance of radio telephones within the dictates of applicable standards, both temporally (due to extended battery life) and geographically (due to improved signal strength in outlying areas).

BRIEF DESCRIPTION OF THE DRAWINGS

The aforementioned aspects, features and advantages of the invention, as well as others, are explained in the following description taken in connection with the accompanying drawings, wherein.

DESCRIPTION OF PREFERRED EMBODIMENT

Figure 1:
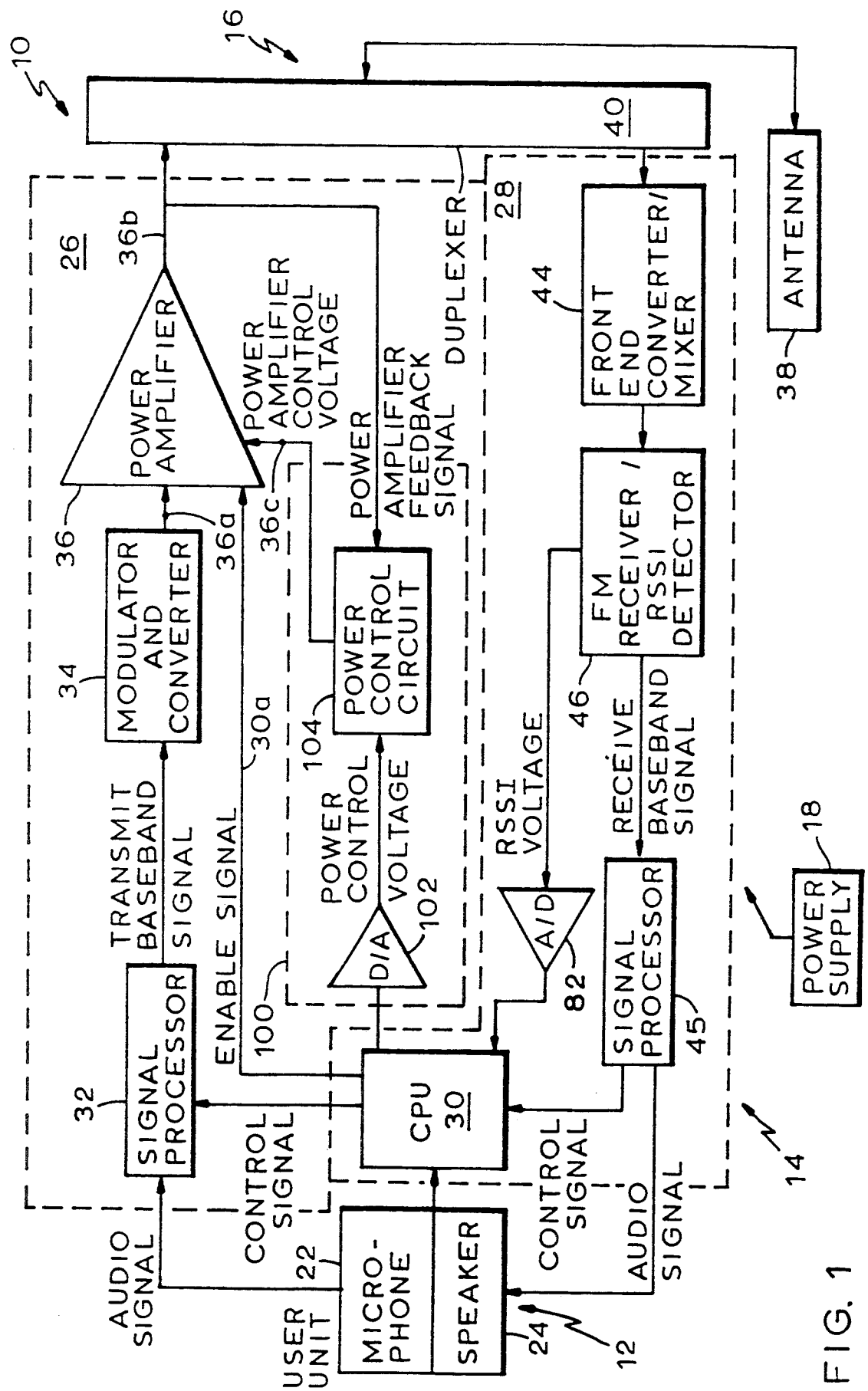
FIG. 1 is a block diagram of a radio telephone in accordance with a preferred embodiment of the invention.

FIG. 1 shows a radio telephone 10 in accordance with a preferred embodiment of the invention. The radio telephone 10 includes a user unit 12, a transceiver 14, a conventional antenna system 16, and a conventional regulated power supply, e.g., including batteries 18.

The user unit 12 provides a user/telephone interface, and includes a microphone 22 for converting sounds, e.g., messages spoken by a user or other audio data, into an electrical signal representing those sounds, called a "transmit audio signal." The user unit 12 also includes a speaker 24 for converting an electrical signal containing audio data, called a "receive audio signal," into sound, e.g., messages being communicated to the user. Where the user unit 12 is a handset, which is most often the case today, a mouthpiece (not shown) of the handset contains the microphone 22 and an earpiece thereof (not shown) contains the speaker 24. The user unit 12 typically includes also a keypad and display (not shown).

The transceiver 14 has a transmitter 26, a receiver 28, and a central processing unit ("CPU") 30 for controlling many of the operations of the transmitter 26 and receiver 28 (and for receiving and providing information to the user unit 12).

The transmitter 26 includes a signal processor 32 for processing (e.g., filtering and amplifying) audio signals from the microphone 22 and control signals from the CPU 30. The output of the signal processor 32 is called the "transmit baseband signal." This signal is fed to a modulator and converter 34. There, an RF carrier signal is, preferably, frequency modulated with the transmit baseband signal.

The transmitter 26 also includes a conventional, variable-gain, RF power amplifier 36 for boosting the power of the modulated RF signal from the modulator and converter 34. The power amplifier 36 receives the modulated RF signal at a signal input 36a thereof, and produces an amplified version of the signal at its output 36b. The amplified signal from the power amplifier 36 is fed to the antenna system 16.

The antenna system 16 includes both an antenna 38 and a duplexer 40 for full-duplex two-way conversations, i.e., for permitting the antenna 38 to be used both for transmitting the output from the power amplifier 36, and for receiving communication signals broadcast from base stations (not shown). The duplexer 40 includes a filter arrangement, which is not separately shown.

The receiver 28 has a conventional front-end converter and mixer 44 for converting the RF signal from the duplexer 40 into an intermediate-frequency ("IF") signal. The receiver 28 also has an FM receiver and RSSI detector 46, which both (i) extracts the received baseband signal from the RF signal, and (ii) produces an RSSI having a voltage amplitude that varies in response to the strength of the IF signal, and, thus, of the in-coming RF signal.

The received baseband signal is fed to a conventional signal processor 45. The signal processor 45 processes (e.g., filtering and amplifying) the received baseband signal, separating it into audio and control signals. The audio signals are provided to the speaker 24, and the control signals go to the CPU 30.

Figure 2:
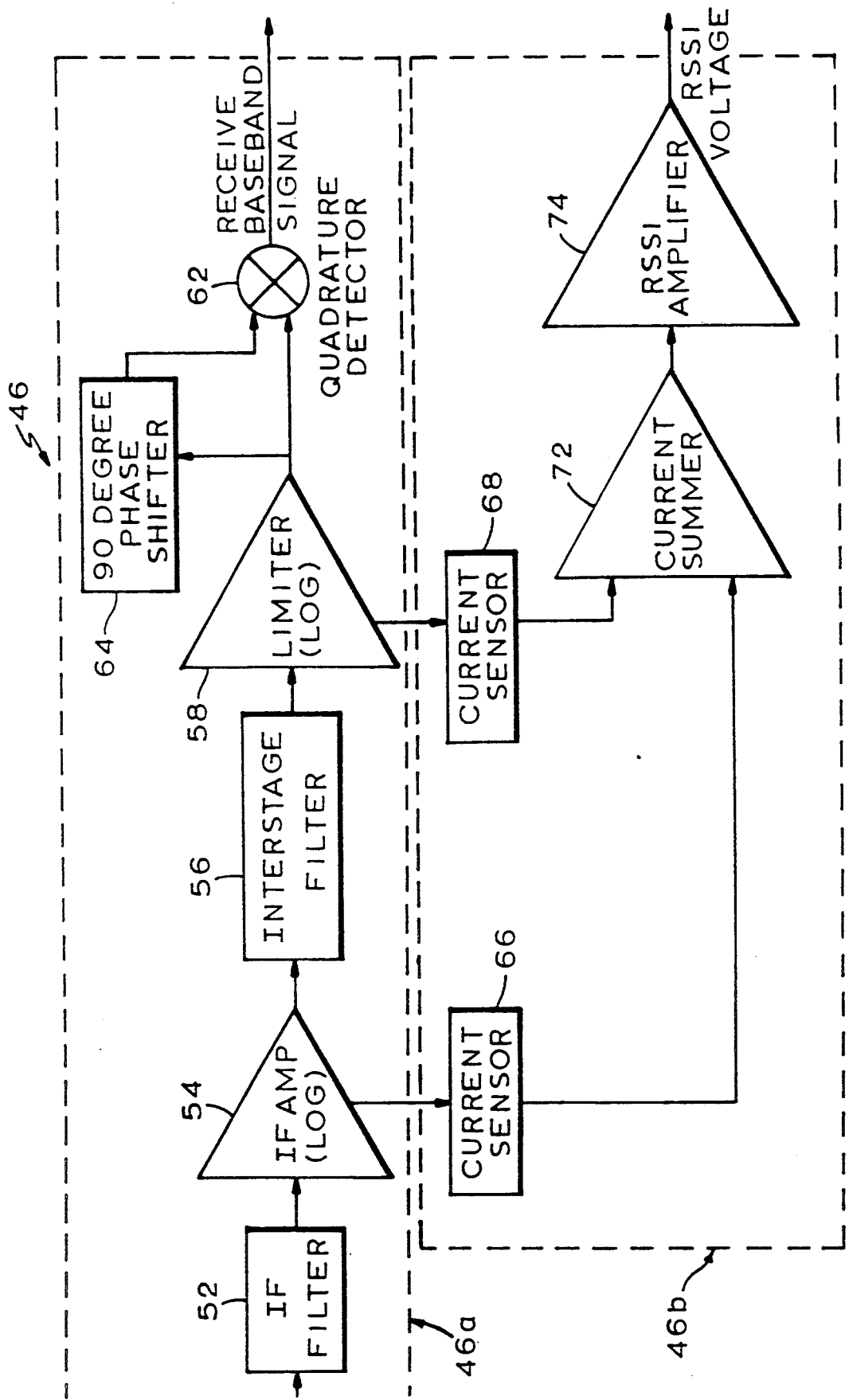
FIG. 2 is a block diagram of the FM receiver and RSSI detector of FIG. 1.

FIG. 2 shows the FM receiver and RSSI detector 46 in more detail. The chain of boxes across the top of the drawing together form an FM receiver 46a. An IF filter 52 filters the IF signal from the front-end converter and mixer 44 so as to reduce broadband noise, and thereby improve the signal-to-noise ratio. The IF filter 52 passes its output to an IF log amplifier 54. Next, an interstage filter 56 further eliminates noise from the IF signal for an even better signal-to-noise ratio, and passes its output to a limiter amplifier 58. The output of the limiter 58 is fed directly to a first input of a conventional quadrature detector 62. The output of the limiter amplifier 58 is also shifted by 90 degrees in a phase shifter 64, and thence is provided to a second input of the quadrature detector 62. The quadrature detector 62 performs demodulation, and its output is the received baseband signal.

The rest of FIG. 2 constitutes the RSSI detector 46b. Current sensors 66, 68 sense the magnitude of the dc current drawn respectively by the RF amplifier 54 and by the limiter amplifier 58 from the power supply 18. The amounts of current drawn by amplifiers 54, 58 correspond to the degree of amplification performed by them in obtaining respective pre-selected outputs, and, thus, depend on the strength of the signals received by the amplifiers 54, 58. It should be pointed out that the amplification performed by the amplifiers 54, 58 does not affect the content of the signal, since the signal is frequency modulated in the illustrated embodiment.

The RSSI detector 46b also has a current summer 72 and an RSSI amplifier 74. The current summer 72 sums the outputs of the current sensors 66, 68. The resulting signal has a current whose magnitude corresponds to that of the IF signal. The RSSI amplifier 74 converts this signal into an RSSI, that is, into a signal whose voltage level corresponds inversely to the magnitude of the IF signal, which, in turn, corresponds to the strength of the received RF signal.

In high signal-strength areas, e.g., close to transmitting antenna of base stations or cell sites, RSSI values typically are large (e.g., greater than about −60 dBm), while in outlying or fringe areas, e.g., far from transmission sources, RSSI values typically are low (e.g., less than about −100 dBm).

Conventional radio telephones often derive a signal indicative of the strength of received communication signals as well, and this signal is also sometimes referred to as a "received signal strength indicator" or "RSSI". Heretofore, however, the uses to which RSSI measurements have been put have been unduly limited. RSSI has long been used to provide the radio telephone user with a crude indication of received signal strength. More importantly, radio telephones used in cellular telephone systems contain RSSI circuitry for purposes of tuning to the strongest available channels. This is prescribed by applicable standards, such as the above-mentioned EIA/TIA 553, Sections 2.6.1.1.1., 2.6.1.2.1., and 2.6.3.2. The RSSI measurements specified by the standards provide a general indication of the strength of received communication signals for each available channel, and this indication is then used to select the appropriate channel, usually the strongest channel, for communication. Herein, a novel use for RSSI signals is proposed, as will be made clear in the following discussion.

With renewed reference to FIG. 1, the RSSI signal from the FM receiver and RSSI detector 46 is fed to an analog-to-digital converter ("A/D") 82. The A/D 82 converts the RSSI from an analog signal into a digital signal, whose digital values correspond to the amplitude of the analog RSSI signal. The A/D 82 passes the digitized RSSI to the CPU 30 for processing.

Figure 3:
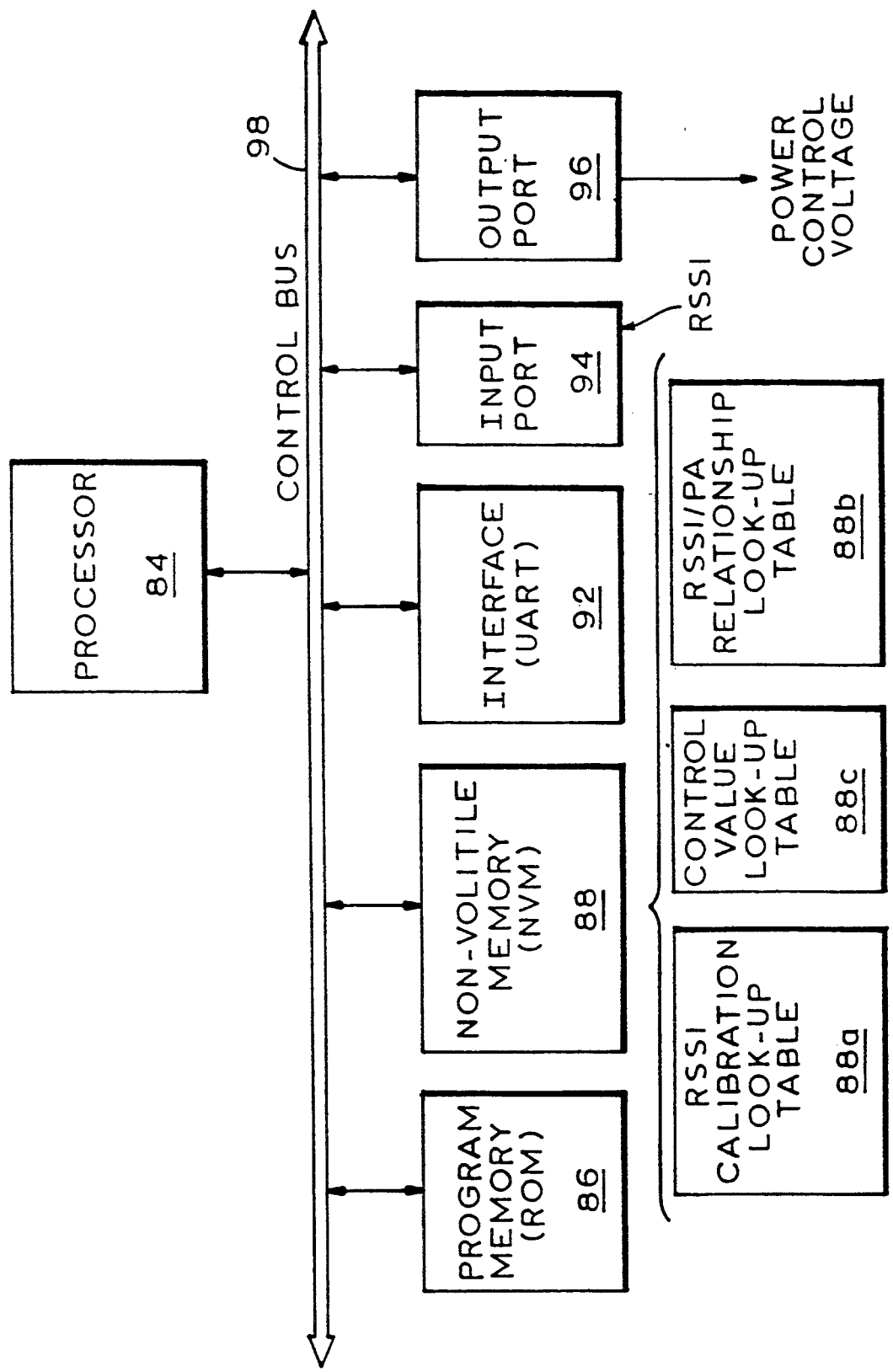
FIG. 3 is a block diagram of the central processing unit of FIG. 1.

FIG. 3 shows the CPU 30 in more detail. The CPU 30 has a processor 84, a read-only memory ("ROM") 86 for storing, e.g., a telephone operating program, a non-volatile memory ("NVM") 88, for storing, e.g., various databases (described below) a universal asynchronous receiver/transmitter ("UART") interface 92 for communication with the keyboard and display unit of the user unit 12, input port 94 for receiving the RSSI from the A/D 82, output port 96, and a control bus 98 interconnecting all of the other CPU components, among other conventional components (not shown). The CPU 30 stores various data concerning the RSSI, and computes a digitized power control signal using the digitized RSSI from the A/D 82, as will be described shortly.

Again with reference to FIG. 1, the radio telephone 10 also has an automatic gain control circuit 100, as mentioned above, for controlling the gain of the power amplifier 36. In accordance with the invention, the AGC circuit 100 processes the digitized power control signal obtained from the output port 96 of the CPU 30 to derive an AGC signal. This AGC signal is applied to a control input 36c of the power amplifier 36 to regulate the gain of the power amplifier 36.

The AGC circuit 100 has a digital-to-analog converter ("D/A") 102 for converting the digital power control signal from the CPU 30 into an analog signal, whose voltage varies in accordance with the digital values of the digital power control signal. The AGC circuit 100 also has a power control circuit 104.

Figure 4:
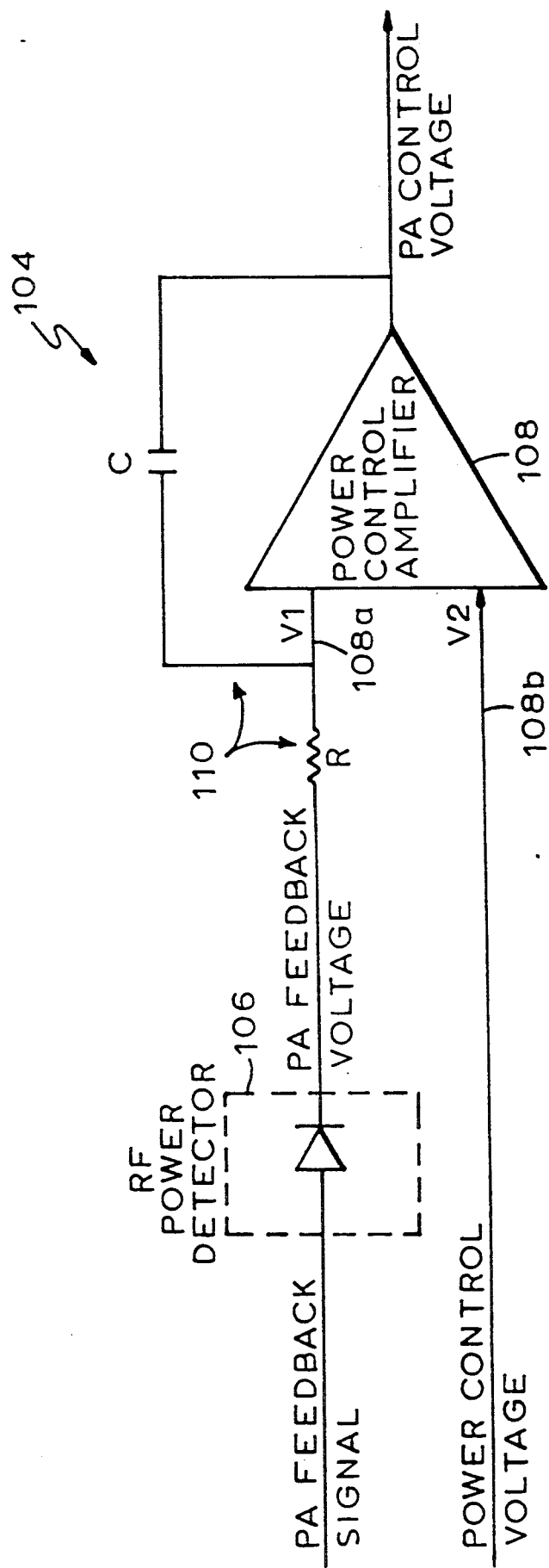
FIG. 4 is a block diagram of the power control circuit of FIG. 1.

FIG. 4 is a schematic representation of the power control circuit 104. An RF power detector 106, e.g., a diode detector, receives a portion of the output of the power amplifier 36 as a power amplifier feedback signal, and provides a feedback voltage that is proportional to the power level of the power amplifier's output to a power control amplifier 108 at its first input 108a. The power control signal from the D/A 102 is provided to a second input 108b of the power control amplifier 108.

Amplifier 108 is adapted with a suitable feedback-capacitor arrangement C to integrate the difference between the signals on its inputs 108a, 108b, with a gain controlled by an RC network 110. The integration thus performed ensures that the AGC circuit 100 exhibits an appropriate dynamic response, i.e., that the AGC circuit 100 is not overly sensitive to transient conditions in the input signals to the power control amplifier 108. The output of the differential amplifier 108 is the AGC signal. A further understanding of the power control circuit 104 can be had with reference to U.S. Pat. No. 4,760,347, issued Jul. 26, 1988, and entitled "Controlled-Output Amplifier and Power Detector Therefore."

It should be apparent from the foregoing discussion that the power control signal plays a central role in the generation of the AGC signal. Accordingly, a further description of the method by which the power control signal is derived shall now be given.

Figure 5:
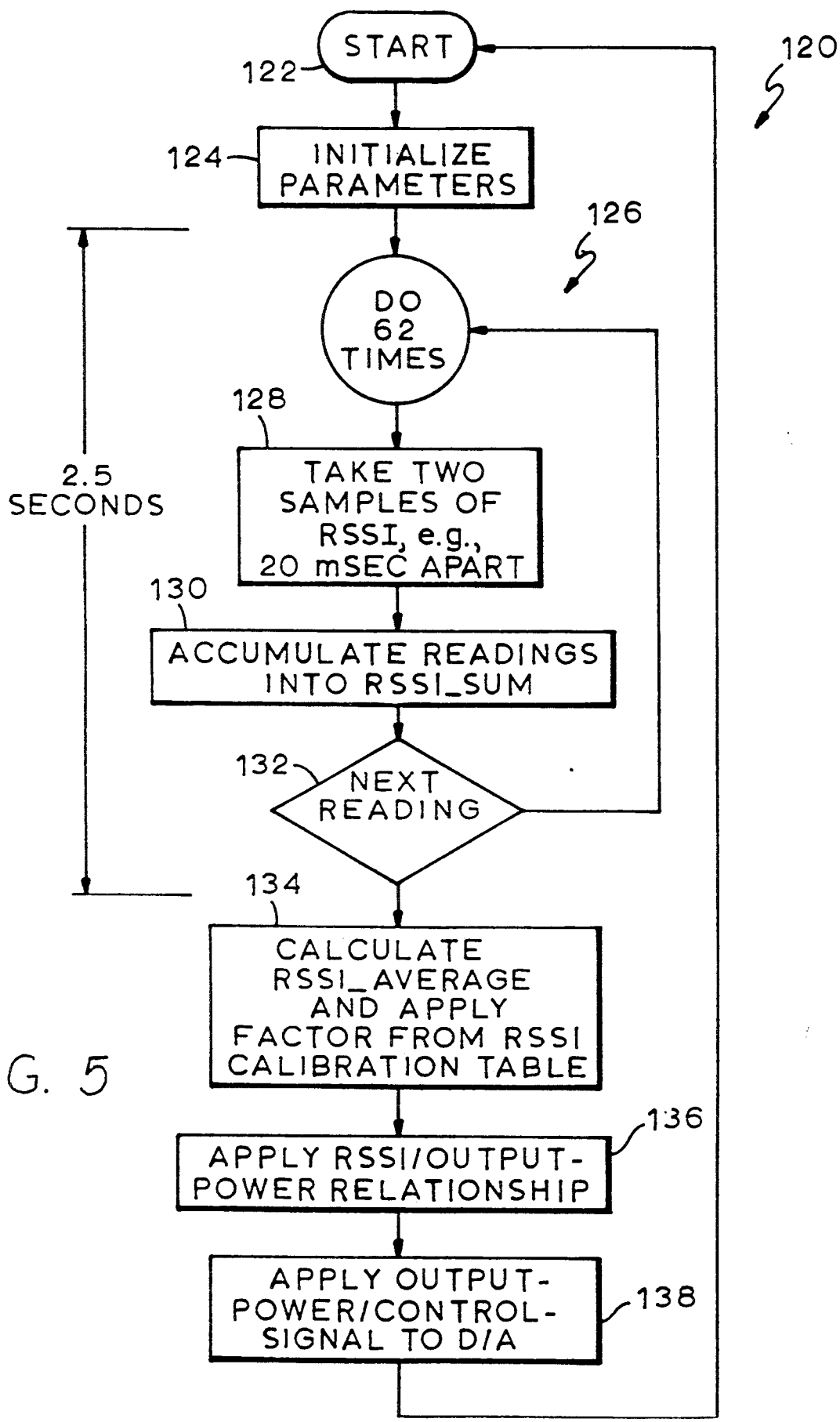
FIG. 5 is an algorithm in flow chart form suitable for execution by the CPU of FIG. 3 in deriving RSSI-based digital control signals.

FIG. 5 shows an algorithm 120 in flow chart form for deriving the power control signal based on the RSSI. When an enable signal is asserted by the CPU 30 over line 30a to the power amplifier 36 to indicate that the radio-telephone 10 is to transmit, algorithm 120 starts in block 122. In block 124, the algorithm 120 initializes variables, including RSSI SUM and RSSI AVERAGE. Next, the algorithm 120 enters into a do-loop 126 in which the RSSI is sampled repeatedly over a period of time sufficient to provide an adequate update, e.g., over a period of approximately 2.5 seconds, or sixty-two iterations of the loop 126.

In each iteration, the algorithm 120, a block 128, takes in plural (e.g., two) samplings of the RSSI signal from the A/D 82, preferably at fixed time intervals (e.g., at 20 msec. apart). The reason for taking the double sampling of the RSSI is to avoid an aberrationally low reading resulting, e.g., from temporary fading of the RF signal during its propagation to the radio telephone 10. Accordingly, the higher of the readings is selected for further processing, and, in block 130, is added to a running total, called RSSI SUM. Then, as indicated by block 132, the loop 126 is repeated (starting with block 128) until sixty-two iterations have been completed, at which time the loop 126 is exited.

Next, in block 134, the algorithm 120 calculates a time-averaged value, called RSSI AVERAGE, by dividing RSSI SUM by the number of iterations of the loop 26 (in the example, by 62). This further eliminates any false or short term fluctuations in the RSSI measurement.

Then, also in block 134, an RSSI calibration factor is added (or, e.g., otherwise applied) to the calculated RSSI AVERAGE to yield a calibrated or absolute RSSI value. The RSSI calibration factor is preferably stored in a calibration look-up table ("LUT") 88a in the NVM 88 of the CPU 30. The LUT 88a is a database in which calibration factors are stored in locations corresponding to measured RSSI values, and the channels or frequencies to which the receiver 28 (FIG. 1) can be tuned. Thus, the calibration factor is the entry corresponding to the particular measured RSSI value, and to the particular channel over which the communication signal that produced that value was received.

Calibration of the measured RSSI is required for various reasons. First, the RSSI value provided to the CPU 30 can have a transient component due to nonlinearities in the frequency characteristics of the duplexer 40 (FIG. 1) and other components of the radio telephone 10. Thus, the measured RSSI's can vary from one channel to the next, despite identical strengths of the received signals on the various channels. Second, the measured RSSI will depend on the normally-otherwise-acceptable manufacturing tolerances of these components that cause their characteristics to vary from unit to unit. Third, the measured RSSI will depend on the selection of the output level of the IF and limiter amplifiers 54, 58 (FIG. 2), since that level dictates the level of currents drawn by amplifiers 54, 58 (FIG. 2), which currents are detected in deriving the RSSI. For all these reasons, RSSI calibration is appropriate.

After obtaining a calibrated RSSI AVERAGE, algorithm 120 calculates, in block 136, the power amplifier output desired for the prevailing conditions indicated by the absolute RSSI just calculated. This, too, can be achieved expeditiously using an appropriate look-up table 88b stored in NVM 88 (FIG. 2) in the CPU 30 (FIG. 1). The entries in the look-up table 88b establish an RSSI/output-power relationship.

Figure 6:
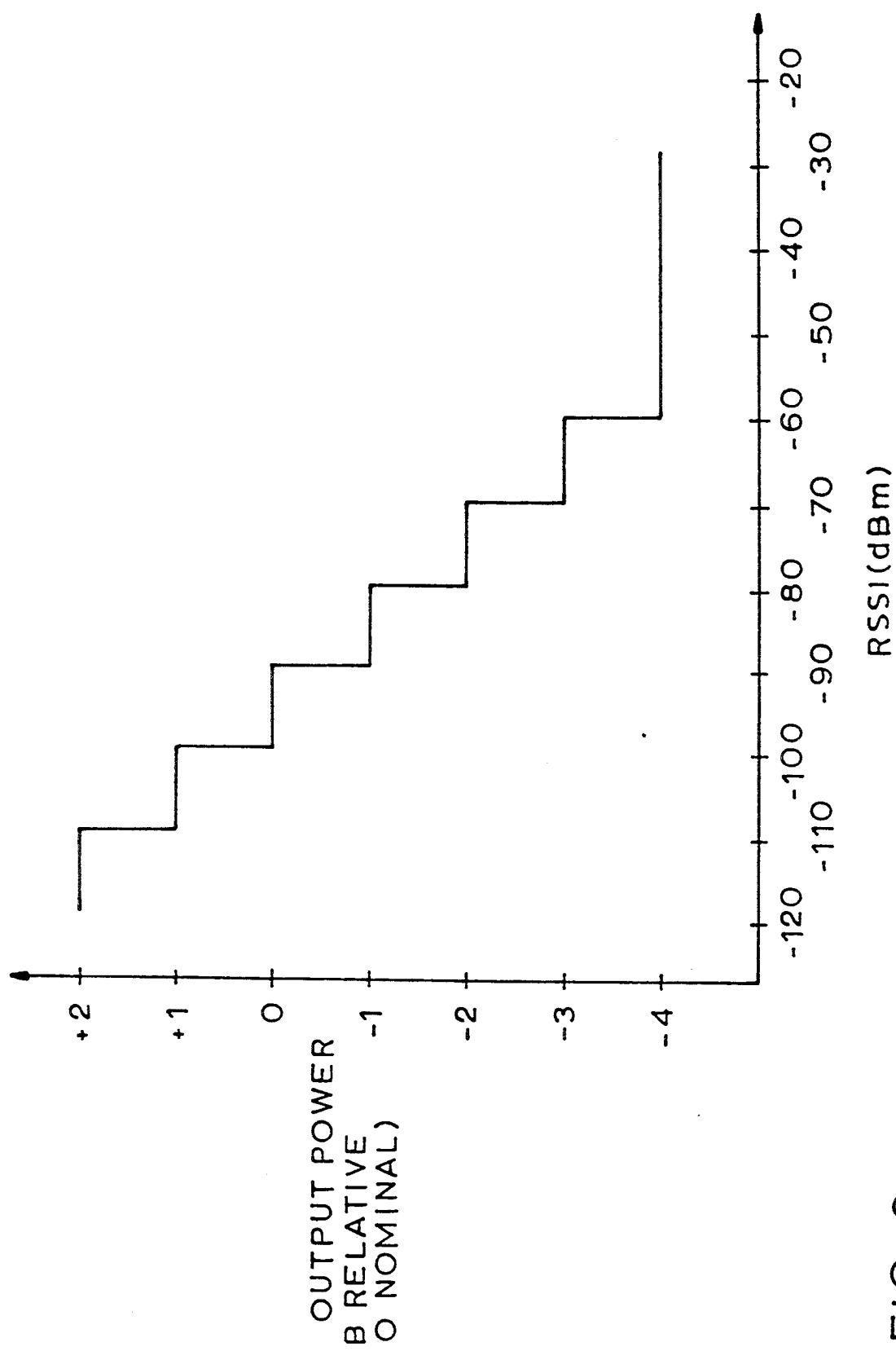
FIG. 6 is a graph of the relationship between the power amplifier output power (dB relative to nominal) and RSSI (dBm) for an illustrative application of the invention.

FIG. 6 depicts graphically the inverse relationship between calibrated RSSI and the power amplifier output power for an illustrative cellular-telephone application. As can readily be seen, for this application, output power increases in steps as RSSI decreases.

Between a first threshold, e.g., about −100 dBm, and a second threshold, e.g., about −90 dBm, nominal output power can be used. For lower RSSI values, i.e., below the first threshold, higher output power can be used advantageously, that is, the output power can be raised above the nominal value. As depicted, for example, output power can be increased by 1 dB for each 10 dBm decrease in RSSI below the first threshold. For higher values of RSSI, i.e., above the second threshold, the output power can be lowered from nominal power. The graph shows output power being lowered by 1 dB for each 10 dBm increase in RSSI. Of course, the rates of increase in output power per drop in RSSI values below the first threshold and of decrease in output power per rise in RSSI values above the second threshold can be any desired amounts, and certainly need not be equal.

In other words, for RSSI values above the first threshold, the power amplifier can be controlled so as to render its output power lower than the nominal output power established by applicable standards and typically targeted by conventional AGC circuits. Consequently, the power amplifier consumes less power, and battery life is therefore extended significantly, depending on the type of telephone and prevailing conditions. Thus, for a given battery charge and under favorable conditions, a radio telephone in accordance with the invention can provide the user with significantly more talktime per battery charge.

In addition, for RSSI values below the second threshold, the power amplifier can be controlled so as to render its output power greater than the nominal value, thereby improving transmission strength when (and only when) such improvement is most needed, e.g., in fringe or outlying areas.

With reference again to FIG. 5, in block 138, the algorithm 120 obtains the power control voltage that would produce the desired output power (computed in block 136), e.g., again through the use of a suitable, stored look-up table 88c. The entries of the power-control-voltage/amplifier output-voltage look-up table 88c are preferably empirically derived to account for, and substantially eliminate, unit-to-unit variations in the responses of power amplifiers to control signals. In other words, each entry of the LUT 88c is the precise control signal needed to produce a specified output power in the power amplifier 36.

The entry of LUT 88c identified by the target output power is applied to D/A 102 as the power control voltage, and continues to be applied thereto until such time as a different power-control voltage is determined in block 138. Then, after step 138, the algorithm 120 returns to its starting block 122.

A suitable methodology for deriving the calibration look-up table 88a for RSSI values is as follows: An RF signal generator provides RF signals to an antenna port 40b (FIG. 1) of the duplexer 40 (FIG. 1). These signals are of known power levels, and of known and tunable frequencies. The radio telephone 10 (FIG. 1) treats each signal from the signal generator as it would a received communication signal, and derives the RSSI AVERAGE value for that signal, as described hereinabove. This derived RSSI AVERAGE value is compared with a known value corresponding to that RF signal, and the difference is stored as an entry in the look-up table 88a at a location corresponding to the frequency of the applied signal. Typically, it is necessary to sample RSSI at only a single received level provided by the RF signal generator for each of a plurality of frequency segments or bands. Preferably, RSSI calibration is performed at the radio telephone manufacturing facility.

The operation of radio telephone 10 will now be described. In accordance with the invention, when a communication signal is received over a voice channel, the FM receiver and RSSI detector 46 produces an RSSI signal to indicate the prevailing signal propagation conditions encountered by the received signal. A digitized version of the RSSI is supplied to the CPU 30 by receiver 28.

The CPU 30 samples this RSSI signal and derives an average value for the signal over a reasonably long period of time (e.g., 2.5 seconds). This average value is then calibrated to provide a truer indication of prevailing signal propagation conditions. To accomplish such calibration, the average RSSI value and the frequency of the received signal are used as pointers into the calibration table 88a. The resulting calibrated absolute RSSI value is used in deriving a desirable transmission power for the signal propagation conditions indicated by the RSSI. To do so, the absolute RSSI is used as a pointer into a further look-up table, 88b. The resulting target output power for the amplifier 36 is then used to obtain a suitable power control signal, which, when applied to the AGC circuit, will produce an output power from the amplifier 36 equal to the computed target output power. This can be accomplished by using the target output power value as a pointer into look-up table 88c. The entry so located is provided to the AGC circuit 100.

The AGC circuit 100 also receives a portion of the output of the power amplifier 36 as a feedback signal, and derives an AGC signal proportional to the difference between the power control signal and the power amplifier feedback signal. Completing a feedback loop, the AGC signal is applied to the control input 360 of the power amplifier 36 so as to control its gain, and drive the power level of its output toward the target power level computed by the CPU 30.

Preferably, the output of the power amplifier 36 remains at all times within a power range prescribed by applicable standards, and is increased or decreased within the power range by operation of the AGC circuit 100 in accordance with prevailing conditions indicated by the RSSI. The AGC circuit 100 preferably drives the output power to the lowest level within the specified range that provides an adequately strong communication signal in light of prevailing propagation conditions.

The foregoing description has been limited to a specific embodiment of this invention. It will be apparent, however, that variations and modifications may be made to the invention, with the attainment of some or all of the advantages of the invention. For example, for many applications, the look-up tables can be consolidated into a single table, which, when referenced by the average RSSI, will yield the digital power control signal for use by the AGC circuit 100. Therefore, it is the object of the appended claims to cover all such variations and modifications as come within the true spirit and scope of the invention.

What is claimed as new and desired to be secured by Letters Patent is:

1. A radio telephone for receiving a first broadcasted, radio-frequency communication signal over a selected channel from which an acoustic signal is extracted and provided to a speaker, and for transmitting an amplified, second, radio-frequency communication signal over said selected channel, aid radio telephone comprising:
   A) means for generating a strength-indicating signal representative of the strength of said received first communication signal;
   B) means responsive to said strength-indicating signal for generating a control signal, said control-signal-generating means including
      (i) means for calibrating said strength-indicating signal using a calibration factor corresponding to said selected channel, and
      (ii) means for deriving said control signal using said calibrated strength-indicating signal; and
   C) means coupled to said control-signal-generating means for amplifying a second communication signal in response to said control signal to produce an amplified second communication signal.

2. The radio telephone in accordance with claim 1 wherein said amplifying means amplifies the power of said second communication signal with a controllable gain, and said amplifying means includes means for controlling the gain in response to said control signal, such that said second communication signal is amplified to the lowest power level within a defined range of power levels that provides an adequately strong communication signal in light of prevailing signal propagation parameters.

3. The radio telephone in accordance with claim 2, wherein aid control signal causes said amplifying means to increase said power level to a higher power level within said range when the strength of said received first communication signal is below a first selected threshold, and wherein said control signal causes said amplifying means to decrease said power level to a power level within said range when the strength of said received first communication signal is above a second selected threshold.

4. The radio telephone in accordance with claim 1, wherein said calibration factor corresponds to the value of said strength-indicating signal.

5. A communication apparatus for receiving a radio-frequency receive signal over a selected channel, and for transmitting an amplified radio-frequency transmit signal over said selected channel at a selected power level within a defined range of power levels, said communication apparatus comprising:
   A) a transmitter including means for converting audio and control signals into said transmit signal, means for amplifying said transmit signal, said amplifying means having a gain responsive to a gain control signal, and a gain control circuit for deriving said gain control signal from a power control value; and
   B) a receiver including means for converting said receive signal into audio and control signals, and means for deriving a signal indicative of the strength of said receive signal, whereby said receive-signal-strength signal is indicative of prevailing signal propagation conditions; and
   C) a processor coupled to said transmitter and said receiver, said processor
      (i) computing a time-averaged value of said receive-signal-strength signal over a selected period of time,
      (ii) calibrating said time-averaged value using a calibration factor corresponding to said received-signal-strength signal and to said selected channel,
      (iii) deriving a target power level for said transmit signal using said calibrated time-averaged value, said target power level being within said range of power levels; and
      (iv) deriving said power control value using said target power level, and
   wherein said gain control signal controls the gain of aid power amplifier to drive said power level of said transmit signal toward said target power level in response to an indication of prevailing signal propagation characteristics.

6. The communication apparatus of claim 5, wherein said processor selects said target power level to be the lowest level within the defined range that provides an adequately strong transmit signal in light of prevailing propagation conditions.

7. Apparatus for controlling the power level of signals transmitted by a radio telephone, said telephone having a transmitter including a power amplifier whose gain is controlled by an automatic-gain-control circuit, said apparatus comprising:
   A) means responsive to a received communication signal for deriving an analog signal to indicate the strength of the received communication signal, and thereby to indicate prevailing signal propagation conditions encountered by the received signal,
   B) means for converting the strength-indicating signal into a digital signal, C) means for sampling the digital strength-indicating signal and deriving an average value therefrom over a selected period of time, whereby transient components of the signal are reduced, D) means for calibrating the average value of the digital strength-indicating signal, E) means responsive to the calibrated strength-indicating value for deriving a target transmission power for the signal propagation conditions indicated thereby, F) means responsive to the target transmission power for deriving a power control signal, which, when applied to the automatic-gain-control circuit, will produce an output power from the amplifier equal to the target transmission power, and G) means for applying the power control signal to the automatic-gain-control circuit, and H) wherein said automatic-gain-control circuit includes means for deriving an automatic gain control signal corresponding to the difference between the power control signal and the power amplifier output, and for applying the automatic gain control signal to a control input of the power amplifier so as to control its gain, and thereby drive the power level of its output toward the target transmission power.

8. The apparatus in accordance with claim 7, wherein the target-transmission-power-deriving means selects the target transmission power from a range of target transmission powers, such that a higher target transmission power from said range is selected when the calibrated strength-indicating signal indicates adverse signal propagation parameters and a lower target transmission power from said range is selected when the calibrated strength-indicating signal indicates favorable signal propagation parameters.

9. The apparatus in accordance with claim 8, wherein said target-transmission-power-deriving means selects the lowest power within the range that would provide a sufficiently strong communication signal in light of prevailing propagation parameters.

10. The apparatus in accordance with claim 7, wherein the calibrating means includes a memory comprising calibration look-up table means, and the average strength-indicating value is used as a pointer into the calibration look-up table means to obtain a calibrated strength-indicating value therefrom.

11. The apparatus in accordance with claim 7, wherein the target-transmission-level-deriving means includes a memory comprising target-transmission-power look-up table means, and the calibrated strength-indicating value is used as a pointer into the target-transmission-power look-up table means to obtain a target transmission power therefrom.

12. The apparatus in accordance with claim 7, wherein the power-control-signal-deriving means includes a memory comprising power-control-signal look-up table means, and the target transmission power is used as a pointer into the power-control-signal look-up table means to obtain a power control signal therefrom.

13. Apparatus for controlling the power level of signals transmitted by a radio telephone, said telephone having a transmitter including a power amplifier whose gain is controlled by an automatic-gain-control circuit, said apparatus comprising:

A) means responsive to a received communication signal for deriving an analog signal to indicate the strength of the received communication signal and thereby an indication of prevailing signal propagation conditions encountered by the received signal, B) means for converting the strength-indicating signal into a digital signal, C) means for deriving an average value for the digital signal over a selected period of time, D) means for calibrating the average value of the digital strength-indicating signal, whereby transient components of the signal are reduced, said calibrating means including calibration look-up table means responsive to the average strength-indicating value for providing a calibrated strength-indicating value, E) target-transmission-power look-up table means responsive to the calibrated strength-indicating value for providing a target transmission power, F) power-control-signal look-up table means responsive to the target transmission power for providing a power control signal, which, when applied to the automatic-gain-control circuit, will produce an output power from the amplifier equal to the target transmission power, and G) means for applying the power control signal to the automatic-gain-control circuit, and H) wherein said automatic-gain-control circuit includes means for deriving an automatic-gain-control signal corresponding to the difference between the power control signal and the power amplifier output, and for applying the automatic-gain-control signal to a control input of the power amplifier so as to control its gain, and, thereby drive the power level of its output towards the target transmission power.

14. The apparatus in accordance with claim 13, wherein the target-transmission-power-look-up-table means selects the target transmission power from a range of target transmission powers, such that a higher target transmission power from said range is selected when the calibrated strength-indicating value indicates adverse signal propagation parameters and a lower target transmission power from said range is selected when the calibrated strength-indicating value indicates favorable signal propagation parameters.

15. The apparatus in accordance with claim 14, wherein said target-transmission-power-look-up-table means selects the lowest power within the range that would provide a sufficiently strong communication signal in light of prevailing propagation parameters.

16. A method of controlling the power of an RF signal amplified by a variable-gain power amplifier of a radio telephone prior to transmission thereof, said method comprising:

A) determining prevailing signal propagation conditions by,
  i) generating a strength-indicating signal representative of the strength of a communication signal received over a selected channel, and
  ii) calibrating said strength-indicating signal using a calibration factor corresponding to said selected channel.

B) computing a target power level for said RF signal using the calibrated strength-indicating signal, and C) controlling the gain of said power amplifier by generating a control signal that will drive the output power of said power amplifier toward said target power level, and applying said control signal to said amplifier.

17. Method of controlling the power level of signals transmitted by a radio telephone, said telephone having a transmitter including a power amplifier whose gain is controlled by an automatic-gain-control circuit, said method comprising the steps of:
- A) from a received communication signal, deriving an analog signal to indicate the strength of the received communication signal and thereby an indication of prevailing signal propagation conditions encountered by the received signal,
- B) converting the strength-indicating signal into a digital signal,
- C) sampling the digital strength-indicating signal and deriving an average value for the signal over a selected period of time,
- D) calibrating the average value of the digital strength-indicating signal, whereby transient components of the signal are reduced,
- E) from the calibrated strength-indicating value, deriving a target transmission power for the signal propagation conditions indicated thereby,
- F) from the target transmission power, deriving a suitable power control signal, which, when applied to the automatic-gain-control circuit, will produce an output power from the amplifier equal to the target transmission power,
- G) applying the power control signal to the automatic gain-control circuit,
- H) in the automatic-gain-control circuit, deriving an automatic-gain-control signal proportional to the difference between the power control signal and the power amplifier output, and applying the automatic gain control signal to a control input of the power amplifier so as to control its gain, and drive the power level of its output toward the target transmission power.

18. The method in accordance with claim 17, wherein the step of deriving the target transmission power includes the step of selecting the target transmission power from a range of target transmission powers, such that a higher target transmission power from said range is selected when the calibrated strength-indicating value indicates adverse signal propagation parameters and a lower target transmission power from said range is selected when the calibrated strength-indicating value indicates favorable signal propagation parameters.

19. The method in accordance with claim 18, wherein said step of deriving a target transmission power includes the step of selecting the lowest power within the range that would provide a sufficiently strong communication signal in light of prevailing propagation parameters.

20. The method in accordance with claim 17, wherein the calibrating step includes the step of using the average strength-indicating value as a pointer into a calibration table.

21. The method in accordance with claim 17, wherein the step of deriving the target transmission level includes the step of using the calibrated strength-indicating value as a pointer into a target-transmission-power look-up table.

22. The method in accordance with claim 17, wherein the step of deriving the power control signal includes the step of using the target transmission power as a pointer into a power-control-signal look-up table.

* * * * *